(12) United States Patent
Chiang et al.

(10) Patent No.: US 9,337,209 B1
(45) Date of Patent: May 10, 2016

(54) SEMICONDUCTOR DEVICE AND METHOD OF FABRICATING THE SAME

(71) Applicant: MACRONIX INTERNATIONAL CO., LTD., Hsinchu (TW)

(72) Inventors: Chun-Ling Chiang, Hsinchu (TW); Chun-Min Cheng, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 14/588,050

(22) Filed: Dec. 31, 2014

(51) Int. Cl.
  *H01L 21/8242* (2006.01)
  *H01L 29/76* (2006.01)
  *H01L 29/94* (2006.01)
  *H01L 31/062* (2012.01)
  *H01L 31/113* (2006.01)
  *H01L 31/119* (2006.01)
  *H01L 27/115* (2006.01)
  *H01L 21/3213* (2006.01)
  *H01L 21/28* (2006.01)

(52) U.S. Cl.
  CPC .... *H01L 27/11582* (2013.01); *H01L 21/28282* (2013.01); *H01L 21/32133* (2013.01); *H01L 27/11568* (2013.01)

(58) Field of Classification Search
  CPC ............... H01L 21/32133; H01L 27/11582
  USPC .................................. 438/254; 257/288
  See application file for complete search history.

(56) References Cited

U.S. PATENT DOCUMENTS

| | | | |
|---|---|---|---|
| 2013/0126978 A1* | 5/2013 | Becker | H01L 27/092 257/369 |
| 2015/0028398 A1* | 1/2015 | Cheng | H01L 29/785 257/288 |
| 2015/0287809 A1* | 10/2015 | Kerber | H01L 21/845 438/479 |
| 2015/0325452 A1* | 11/2015 | Zhu | H01L 21/31056 438/283 |

* cited by examiner

Primary Examiner — David S Blum
(74) Attorney, Agent, or Firm — J.C. Patents

(57) ABSTRACT

A method of fabricating a semiconductor device, including the following steps. A plurality of fin structures are formed on a substrate. There is a trench between the fin structures. At least two times of circulating processes are performed. The circulating processes include: a deposition process and an etching process. The deposition process is performed to fill a first conductor material layer in the trench. The first conductor material layer covers top parts and sidewalls of the fin structures. The etching process is performed to remove a part of the first conductor material layer.

20 Claims, 7 Drawing Sheets

SEMICONDUCTOR DEVICE AND METHOD OF FABRICATING THE SAME

BACKGROUND OF THE INVENTION

1. Field of the Invention

The invention relates to a semiconductor device and a method of fabricating the same.

2. Description of Related Art

As semiconductor devices are integrated, in order to achieve high density and high performance, it is preferred to form a structure stacked upward when fabricating the semiconductor devices, such that the wafer area can be used more efficiently. Therefore, semiconductor structures having a high aspect ratio are commonly seen in small-sized devices. For example, the semiconductor structure includes trenches with a high aspect ratio, for example.

Generally speaking, fabrication of the device includes filling a conductor layer into the trenches with a high aspect ratio. However, since the conductor layer itself does not have a preferable gap-filling ability, unevenly distributed voids are easily formed in the trenches, resulting in a negative influence on electrical testing of the semiconductor device. Besides, the voids may generate unbalanced stresses at two sides of the trench, thus resulting in microbending of the semiconductor structure between the trenches and consequently making the alignment in a subsequent photolithography process more challenging. Thus, how to prevent voids in the trenches with a high aspect ratio and avoid microbending of the semiconductor structures is certainly an issue to work on.

SUMMARY OF THE INVENTION

The invention provides a method of fabricating a semiconductor device capable of effectively preventing formation of unevenly distributed voids when filling a conductor material in a trench with a high aspect ratio.

The invention provides a method of fabricating a semiconductor device, including the following steps. A plurality of fin structures are formed on a substrate. A trench is located between the fin structures. At least two times of circulating processes is performed, so as to form a first conductor layer. Each time of the circulating processes includes: a deposition process and an etching process. The deposition process is performed to fill a first conductor material layer in the trench, wherein the first conductor material layer covers top parts and sidewalls of the fin structures. The etching process is performed to remove a part of the first conductor material layer. In addition, a first thickness of the first conductor layer is adjusted to be less than a second thickness of the first conductor layer. The first thickness is a thickness of the first conductor layer at upper parts of the sidewalls of the fin structures, and the second thickness is a thickness of the first conductor layer at lower parts of the sidewalls of the fin structures.

According to an embodiment of the invention, after performing the circulating processes, the method further includes: filling a second conductor material layer in the trench.

According to an embodiment of the invention, a difference between the first thickness and the second thickness is adjusted to be greater than 1 Å and less than 5 Å.

According to an embodiment of the invention, after the steps of the circulating processes are performed, the thickness of the first conductor layer gradually decreases from the lower parts of the sidewalls of the fin structures to the upper parts of the sidewalls of the fin structures.

According to an embodiment of the invention, after the steps of the circulating processes are performed, a first angle between a surface of the first conductor layer and a surface of the substrate is less than a second angle between the sidewalls of the fin structures and the surface of the substrate.

According to an embodiment of the invention, the step of forming the fin structures on the substrate includes: forming a plurality of strip layers; and forming a charge storage layer to cover top parts and sidewalls of the strip layers.

According to an embodiment of the invention, the step of forming the fin structures on the substrate includes: forming a plurality of stack layers; and forming a charge storage layer to cover top parts and sidewalls of the stack layers.

According to an embodiment of the invention, the step of forming the stack layers includes: forming at least one conductor layer and at least one dielectric layer that are alternately stacked with respect to each other.

The invention provides a semiconductor device, including: a substrate; a plurality of fin structures, and a first conductor layer. The plurality of fin structures are located on the substrate. The first conductor layer covers sidewalls of the fin structures. A first thickness of the first conductor layer is less than a second thickness of the first conductor layer. The first thickness is a thickness of the first conductor layer at upper parts of the sidewalls of the fin structures, and the second thickness is a thickness of the first conductor layer at lower parts of the sidewalls of the fin structures.

According to an embodiment of the invention, a difference between the first thickness and the second thickness is greater than 1 Å and less than 10 Å.

According to an embodiment of the invention, each of the fin structures includes: a strip layer; and a charge storage layer, covering a top part and a sidewall of the strip layer.

According to an embodiment of the invention, each of the fin structures includes: a stack layer; and a charge storage layer, covering a top part and a sidewall of the stack layer.

According to an embodiment of the invention, each stack layer includes at least one second conductor layer and at least one dielectric layer that are alternately stacked with respect to each other.

According to an embodiment of the invention, the semiconductor device further includes: a second conductor layer, covering a surface of the first conductor layer and a top part of the charge storage layer.

According to an embodiment of the invention, the thickness of the first conductor layer gradually decreases from the lower part of the sidewall of the fin structure to the upper part of the sidewalls of the fin structure.

According to an embodiment of the invention, a first angle between a surface of the first conductor layer and a surface of the substrate is less than a second angle between the sidewall of the fin structure and the surface of the substrate.

The invention further provides a method of fabricating a semiconductor device, including the following steps. A plurality of fin structures are formed on a substrate. There is a trench between the fin structures. The trench is filled with a plurality of layers of a conductor material layer. The conductor material layer covers top parts and sidewalls of the fin structures. A first thickness of at least one conductor material layer is adjusted to be less than a second thickness of the conductor material layer. The first thickness is a thickness of the conductor material layer located at upper parts of the sidewalls of the fin structures, and the second thickness is a thickness of the conductor material layer located at lower parts of the sidewalls of the fin structures.

According to an embodiment of the invention, a difference between the first thickness and the second thickness is adjusted to be greater than 1 Å and less than 10 Å.

According to an embodiment of the invention, the thickness of the conductor material layer gradually decreases from the lower parts of the sidewalls of the fin structures to the upper parts of the sidewalls of the fin structures.

According to an embodiment of the invention, a first angle between a surface of the conductor material layer and a surface of the substrate is less than a second angle between the sidewalls of the fin structures and the surface of the substrate.

Based on the above, in the invention, formation of unevenly distributed voids when filling a conductor material into the trench with a high aspect ratio may be effectively prevented by making the first thickness (the thickness of the first conductor material layer at the upper parts of the sidewalls of the fin structures) of the first conductor material layer, which covers the sidewalls of the fin structures, less than the second thickness (the thickness of the first conductor material layer at the lower parts of the sidewalls of the fin structures) of the first conductor material layer, so as to improve an electrical performance of the semiconductor device.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
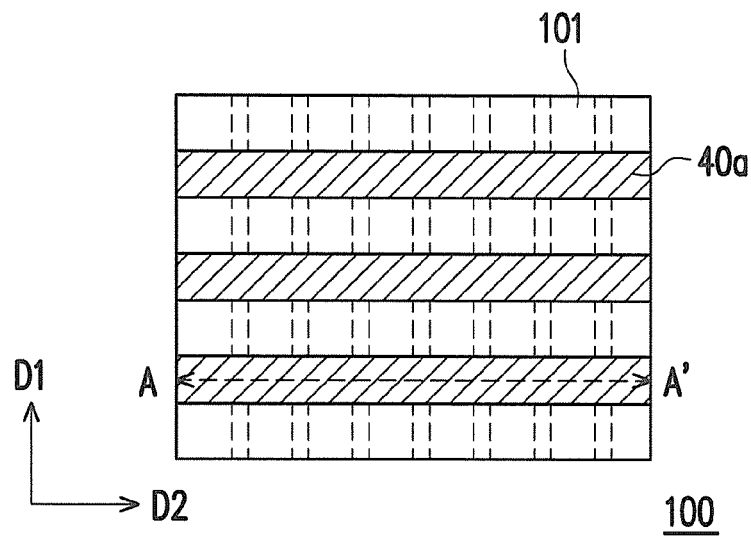
FIG. 1A is a schematic top view illustrating a semiconductor device according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
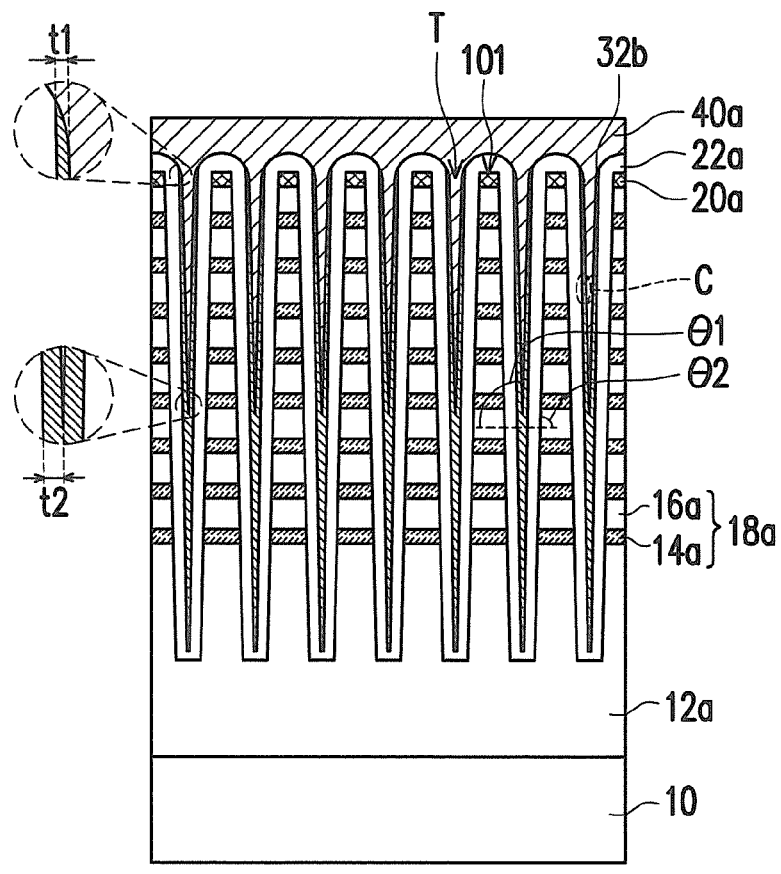
FIG. 1B is a schematic cross-sectional view illustrating the semiconductor device along an A-A' line of FIG. 1A.

FIG. 1A is a schematic top view illustrating a semiconductor device according to an embodiment of the invention. FIG. 1B is a schematic cross-sectional view illustrating the semiconductor device along an A-A' line of FIG. 1A.

Referring to FIGS. 1A and 1B, the semiconductor device 100 includes a substrate 10, a patterned dielectric layer 12a, a plurality of fin structures 101, a plurality of conductor layers 32b, and a plurality of conductor layer 40a. The substrate 10 may include a semiconductor material, an insulator material, a conductor material, or a combination thereof. A material of the substrate 10 is a material composed of at least one selected from a group consisting of Si, Ge, SiGe, GaP, GaAs, SiC, SiGeC, InAs, and InP, or any physical structure suitable for a fabricating process of the invention, for example. The substrate 10 includes a single-layer structure or a multi-layer structure. In addition, a silicon on insulator (SOI) substrate may be used as the substrate 10. The substrate 10 is formed of silicon or silicon germanium, for example.

The patterned dielectric layer 12a is located on the substrate 10. The dielectric layer 12a includes oxide, nitride, oxynitride, or a low dielectric constant material having a dielectric constant smaller than 4. In an embodiment, the dielectric layer 12a is a bottom oxide (BOX) layer, for example. A thickness of the dielectric layer 12a is in a range of 3000 Å to 4000 Å, for example.

The fin structures 101 are located on the dielectric layer 12a. Each of the fin structures 101 extends along a first direction D1. A trench T is between two adjacent fin structures 101. The trench T may be in any length, width, or shape. The trench T may be a wide trench or a narrow trench. In an embodiment, a width of the trench T is in a range of 200 Å to 300 Å, for example, and a depth of the trench T is in a range of 5000 Å to 6000 Å, for example. In other words, the trench T has a higher aspect ratio. In an embodiment, the aspect ratio of the trench T is in a range of 16 to 30, for example. A cross section of the trench T may be in any shape, such as V shape, U shape, rhombus, or a combination thereof, for example. However, the invention is not limited thereto.

Each of the fin structures 101 includes stack layers 18a and a charge storage layer 22a. Each stack layer 18a includes at least one conductor layer 14a and at least one dielectric layer 16a that are alternately stacked with respect to each other. In an embodiment, the conductor layer 14a is located on the dielectric layer 12a, and the dielectric layer 16a is located on the conductor layer 14a. However, the invention is not limited thereto. In another embodiment, the dielectric layer 16a may also be located on the dielectric layer 12a. The conductor layer 14a and the dielectric layer 16a are alternately stacked upward on the substrate 10 to form the stack layers 18a. In terms of geometry, an angle θ1 between a sidewall of each of the fin structures 101 and a surface of the substrate 10 is greater than 85.0 degrees and less than 89.9 degrees, for example. Besides, a corner part C of each stack layer 18a may have a radian. The dielectric layer 16a and the dielectric layer 12a may be formed of the same or different materials. A material of the dielectric layer 16a may include oxide, nitride, oxynitride, or a low dielectric constant material having a dielectric constant smaller than 4. A thickness of the dielectric layer 16a is in a range of 300 Å to 500 Å, for example. A material of the conductor layer 14a includes an undoped semiconductor or a doped semiconductor, such as polysilicon or doped polysilicon. A thickness of the conductor layer 14a is in a range of 200 Å to 300 Å, for example. In an embodiment, the conductor layer 14a serves as a bit line or a word line of the semiconductor device 100, for example. Also, in this embodiment, the fin structures 101 are in a configuration that the charge storage layers 22a are disposed on the stack layers 18a formed of polysilicon layers and oxide layers alternately disposed with respect to each other, for example.

Continuing to refer to FIGS. 1A and 1B, each of the fin structures 101 may selectively include a hard mask layer 20a. The hard mask layer 20a is at the topmost layer of the fin structure 101, for example. However, the invention is not limited thereto. The hard mask layer 20a may be a single layer or multiple layers. A material of the hard mask layer 20a is silicon oxide, silicon nitride, or other materials having a high Young's modulus, for example. A thickness of the hard mask layer 20a is in a range of 4000 Å to 5000 Å, for example.

The charge storage layer 22a covers a sidewall of the stack layer 18a, a sidewall of the hard mask layer 20a, and a top part of the hard mask layer 20a. A material of the charge storage layer 22a includes oxide, nitride, or a combination thereof. Specifically, the material of the charge storage layer 22a includes silicon nitride, silicon oxide, or a combination thereof. The charge storage layer 22a may be a single layer or multiple layers. In an embodiment, the charge storage layer 22a is a single-layer silicon oxide layer, for example. In another embodiment, the charge storage layer 22a is a composite layer of oxide-nitride-oxide (ONO), for example. A thickness of the charge storage layer 22a is in a range of 200 Å to 300 Å, for example.

The conductor layer 32b is located on the charge storage layer 22a in the trench T and covers a part of a sidewall of the charge storage layer 22a. In other words, the conductor layer 32b covers the sidewall of each of the fin structures 101. The conductor layer 32b may be a single layer or multiple layers. It should be noted that a first thickness t1 of the conductor layer 32b is less than a thickness t2 of the second of the conductor layer 32b. The first thickness t1 refers the thickness of the conductor layer 32b located on an upper part of the sidewall of the fin structure 101, and the second thickness t2 refers to the thickness of the conductor layer 32b located on a lower part of the sidewall of the fin structure 101. In addition, when the conductor layer 32b is a multi-layer structure, the first thickness t1 and the second thickness t2 refer to a total thickness of multiple conductor layers. In other words, the condition is met if the at least one conductor layer has the following thickness distribution: the thickness of the conductor layer at the upper part of the sidewall of the fin structure 101 is less than the thickness of the conductor layer at the lower part of the fin structure 101. In an embodiment, each of the conductor layers has the thickness distribution. In an embodiment, the thickness of the conductor layer 32b gradually decreases from the lower part of the sidewall of each of the fin structures 101 to the upper part of the sidewall of each of the fin structures 101. In an embodiment, a difference between the first thickness t1 and the second thickness t2 is greater than 1 Å and less than 10 Å. However, the invention is not limited thereto. In another embodiment, the angle θ1 between the surface of the conductor layer 32b and the surface of the substrate 10 is less than an angle θ2 between the sidewall of each of the fin structures 101 and the substrate 10. Each conductor layer 32b extends along a second direction D2. The second direction D2 is different from the first direction D1. The second direction D2 is orthogonal to the first direction D1, for example. Each conductor layer 32b is located in the trench T and covers a part of the sidewall of the fin structure 101. A material of the conductor layer 32b is polysilicon, doped polysilicon, a metal material, or a combination thereof, for example. The doped polysilicon is N+ doped polysilicon or P+ doped polysilicon, for example. The thickness of the conductor layer 32b is in a range of 10 Å to 50 Å, for example.

The conductor layer 40a is located on the charge storage layers 22a of the fin structures 101 and extends into the trenches T to be electrically connected with the conductor layers 32b. A material of the conductor layer 40a is polysilicon, doped polysilicon, a metal material, or a combination thereof, for example. The conductor layer 40a extends along the second direction D2. The doped polysilicon is N+ doped polysilicon or P+ doped polysilicon, for example. A thickness of the conductor layer 40a is in a range of 1000 Å to 1400 Å, for example.

The conductor layers 40a and 32b together serve as a word line or a bit line of the semiconductor device 100, for example. It should be noted that when the conductor layers 40a and 32b serve as a word line of the semiconductor device 100, for example, the conductor layer 14a located in the fin structure 101 serves as a bit line. Similarly, when the conductor layers 40a and 32b serve as a bit line of the semiconductor device 100, for example, the conductor layer 14a located in the fin structure 101 serves as a word line.

Although the embodiment above describes the configuration that the stack layer 18a and the charge storage layer 22a form the fin structure 101, the invention is not limited thereto. In the following, another embodiment is provided to illustrate this point. In addition, description about processes/components that are the same as or similar to the processes/components of the above embodiment will be omitted in the following description.

Figure 2:
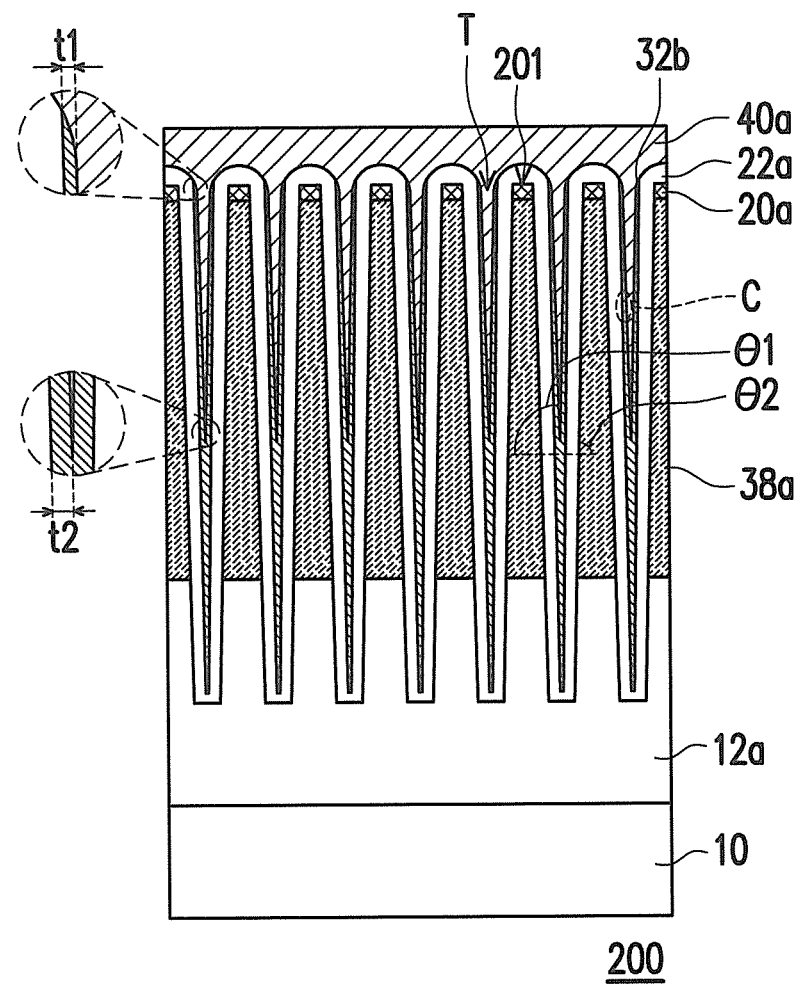
FIG. 2 is a schematic cross-sectional view illustrating a semiconductor device according to another embodiment of the invention.

FIG. 2 is a schematic cross-sectional view illustrating a semiconductor device according to another embodiment of the invention.

Referring to FIGS. 1A, 1B, and 2 together, a difference from the above embodiment is that while a semiconductor device 200 according to another embodiment of the invention is similar to the semiconductor device 100, each fin structure 201 includes a strip layer 38a and the charge storage layer 22a. The strip layer 38a does not include the dielectric layer 16a. Instead, the strip layer 38a is formed of a conductor material. A material of the conductor material layer is polysilicon, doped polysilicon, a metal material, or a combination thereof, for example. The doped polysilicon is N+ doped polysilicon or P+ doped polysilicon, for example. The charge storage layer 22a covers a top part and a sidewall of the strip layer 38a.

In the following, a method of fabricating a semiconductor device according to the invention is described.

FIGS. 3A to 3F are schematic cross-sectional views illustrating a method of fabricating a semiconductor device according to an embodiment of the invention.

Figure 3A:
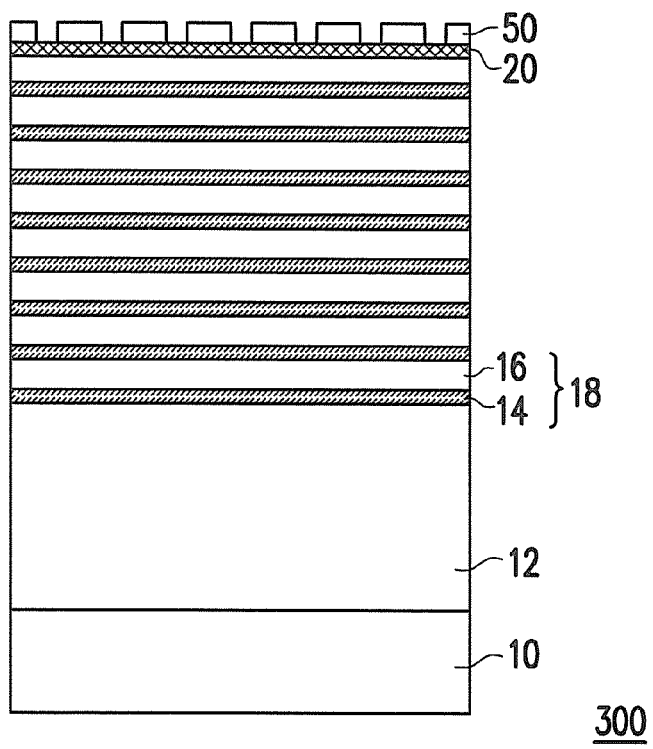
FIGS. 3A to 3F are schematic cross-sectional views illustrating a method of fabricating a semiconductor device according to an embodiment of the invention.

Referring to FIG. 3A, the substrate 10 is provided. The material of the substrate 10 is already described above and thus is not repeated hereinafter. Next, the dielectric layer 12 is formed on the substrate 10. A material and a thickness of the dielectric layer 12 is the same as those in the description about the dielectric layer 12a. A method of forming the dielectric layer 12 includes performing a thermal oxidation process or a chemical vapor deposition process, for example.

Then, a plurality of stack layers 18 are formed on the dielectric layer 12. Specifically, a step of forming the stack layer 18 includes forming the conductor layer 14 and dielectric layer 16 alternately stacked with respect to each other, for example. A method of forming each of the stack layers 18 includes forming the conductor layer 14 on the dielectric layer 12, and then forming the dielectric layer 16 on the conductor layer 14. However, the invention is not limited thereto. In another embodiment, the method of forming the stack layers 18 includes forming the conductor layers 14 and the dielectric layers 16 in sequence on the dielectric layer 12. A material and a thickness of the conductor layer 14 is the same as those in the description about the conductor layer 14a. A method of forming the conductor layer 14 includes performing a chemical vapor deposition process. A material and a thickness of the dielectric layer 16 is the same as those in the description about the dielectric layer 16a. A method of forming the dielectric layer 16 includes performing a thermal oxidation process or a chemical vapor deposition process, for example.

Then, a hard mask layer 20 is formed on the topmost stack layer 18. A material and a thickness of the hard mask layer 20 is the same as those in the description about the hard mask layer 20a. A method of forming the hard mask layer 20 includes performing chemical vapor deposition or metal organic chemical vapor deposition (MOCVD). Then, a patterned photoresist layer 50 is formed on the hard mask layer 20.

Figure 3B:
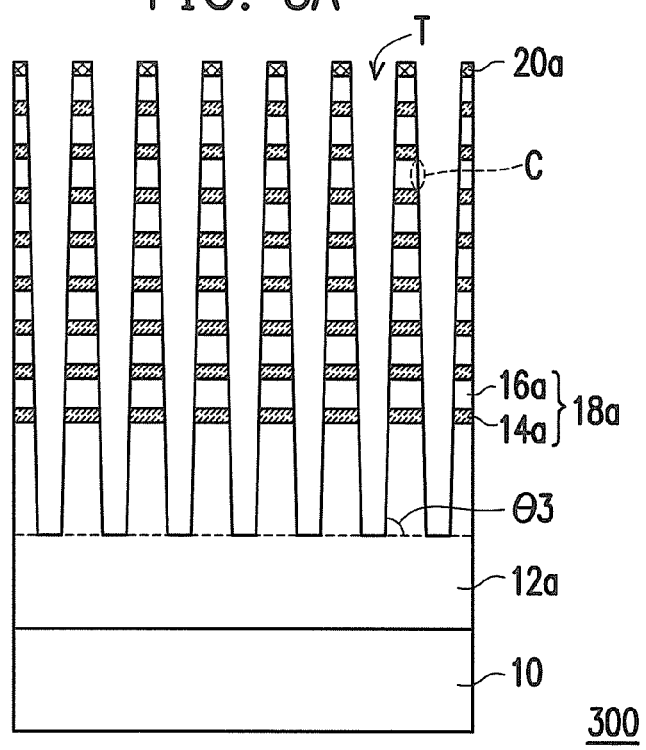

Referring to FIGS. 3A and 3B at the same time, by using the patterned photoresist layer 50 as a mask and performing an etching process, a plurality of the stack layers 18a are formed on the substrate 10, and the trenches T are formed between the stack layers 18a. A method of performing the etching process to the semiconductor device 200 includes performing the etching process to the hard mask layer 20 using the patterned photoresist layer 50 as a mask, so as to transfer a pattern of the patterned photoresist layer 50 to the hard mask layer 20. The etching process includes performing an anisotropic etching process, such as dry etching, for example. The dry etching process may include sputter etching, reactive ion etching, etc. Next, the patterned photoresist layer 50 is removed. Then, using the patterned hard mask layer 20a as a mask, an etching process is performed to the dielectric layers 16, the conductor layers 14, and the dielectric layer 12, so as to form the stack layers 18a on the substrate 10. In addition, an angle θ3 between a sidewall of each of the stack layers 18a and the surface of the substrate 10 is greater than 85.0 degrees and less than 89.9 degrees, for example. Besides, the corner part C of each of the stack layers 18a may have a radian.

Figure 3C:
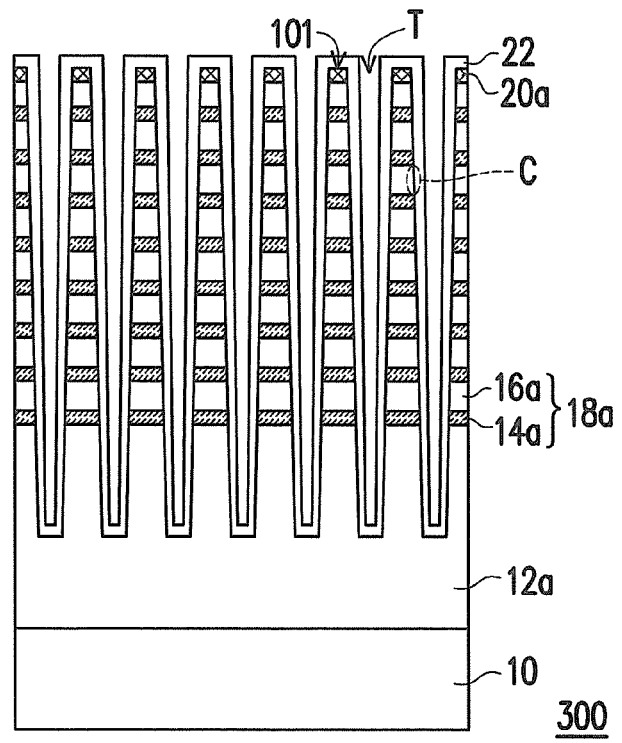

Then, referring to FIG. 3C, a charge storage layer 22 is formed on the substrate 10, so as to form the fin structures 101. The charge storage layer 22 is conformally formed along top surfaces and the sidewalls of the stack layers 18a. In other words, the charge storage layer 22 covers the top parts and the sidewalls of the stack layers 18a. The material and the thickness of the charge storage layer 22 are the same as those described above. A method of forming the charge storage layer 22 includes performing a chemical vapor deposition process or a thermal oxidation process, for example.

Figure 3D:
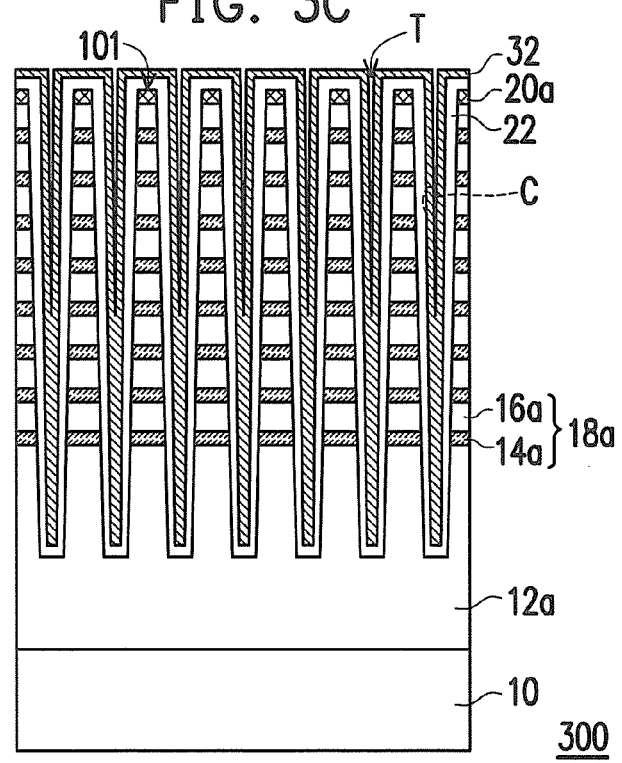
Figure 3E:
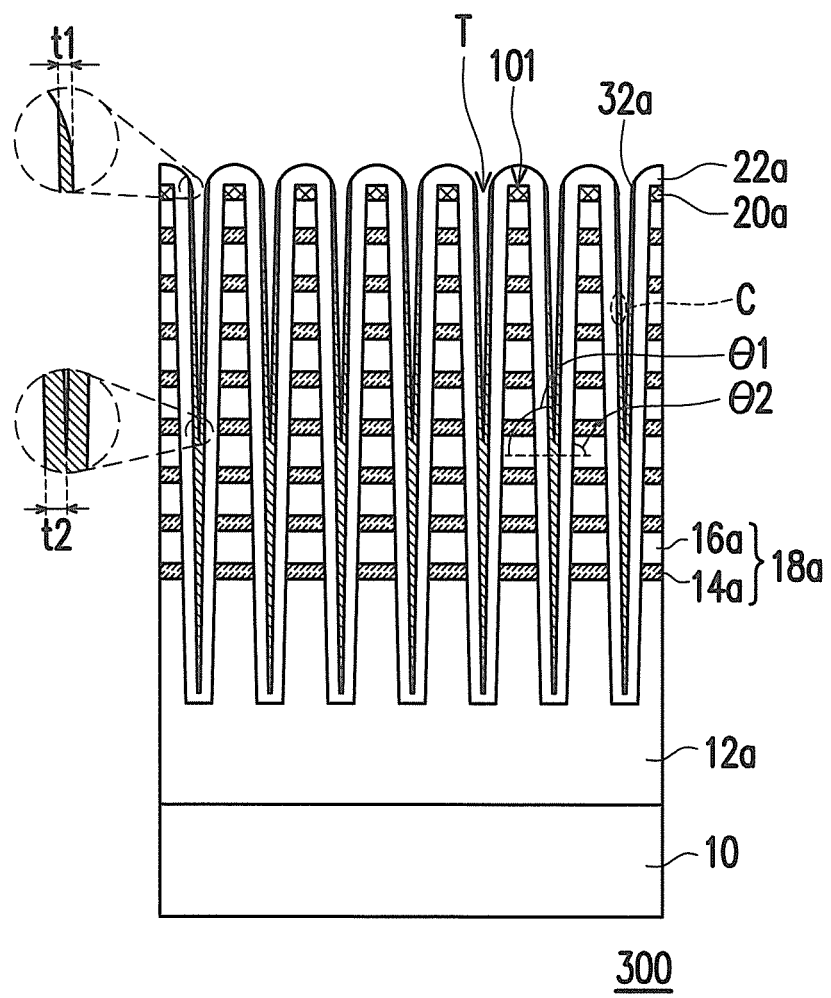

Referring to FIGS. 3C to 3E, circulating processes are performed at least twice, such as 2 times to 10 times, so as to form a single-layer or multi-layer conductor layer 32a in the trench T. Here, performing the circulating processes once refers to performing one deposition process and one etching process. More specifically, referring to FIG. 3C, the deposition process refers to a process of filling a conductor material layer 32 (as shown in FIG. 3D) in the trenches T. The conductor material layer 32 is conformally formed on the charge storage layer 22. In an embodiment, a material of the conductor material layer 32 is polysilicon, doped polysilicon, a metal material, or a combination thereof, for example. The deposition process may include an atomic layer deposition process or a chemical vapor deposition process.

Referring to FIGS. 3D and 3E, the etching process in the circulating processes refers to a process of removing a part of the conductive material layer 32 to unevenly reduce a thickness of the conductor material layer 32. After performing at least two times of the circulating processes, the first thickness t1 of the conductor layer 32a formed accordingly is less than the second thickness t2 of the conductor layer 32a. The first thickness t1 refers the thickness of the conductor layer 32a located at the upper part of the sidewall of the fin structure 101, and the second thickness t2 refers to the thickness of the conductor layer 32a located at the lower part of the sidewall of the fin structure 101. The etching process may include performing an isotropic etching process or an anisotropic etching process. In addition, when the conductor layer 32a is a multi-layer structure, the first thickness t1 and the second thickness t2 refer to a total of a thickness of multiple conductor material layers at different positions. In other words, the condition is met if the at least one conductor material layer in the conductor layer 32a has the following thickness distribution: the thickness of the conductor material layer at the upper part of the sidewall of the fin structure 101 is less than the thickness of the conductor material layer at the lower part of the sidewall of the fin structure 101. In an embodiment, each conductor material layer in the conductor layer 32a has the thickness distribution. In an embodiment, the conductor material layer 32 at a top part of the charge storage layer 22 and a part of the charge storage layer 22 are also removed. In an embodiment, the top part of the charge storage layer 22 is rounded in the etching process. Therefore, after the etching process, a top part of the charge storage layer 22a is in a curved shape. Such curved shape helps fill the conductor material layer in the trench in the subsequent process to avoid formation of unevenly distributed voids.

In an exemplary embodiment, the thickness of the conductor layer 32a gradually decreases from the lower part of the sidewall of the fin structure 101 to the upper part of the sidewall of the fin structure 101. In another exemplary embodiment, the circulating processes are repeatedly performed, so as to produce a difference between the first thickness t1 and the second thickness t2. In addition, the difference is greater than 1 Å and less than 10 Å. However, the invention is not limited thereto. In another embodiment, the angle θ1 between a surface of the conductor layer 32a and the surface of the substrate 10 is less than the angle θ2 between the sidewall of each of the fin structures 101 and the substrate 10.

Figure 3F:
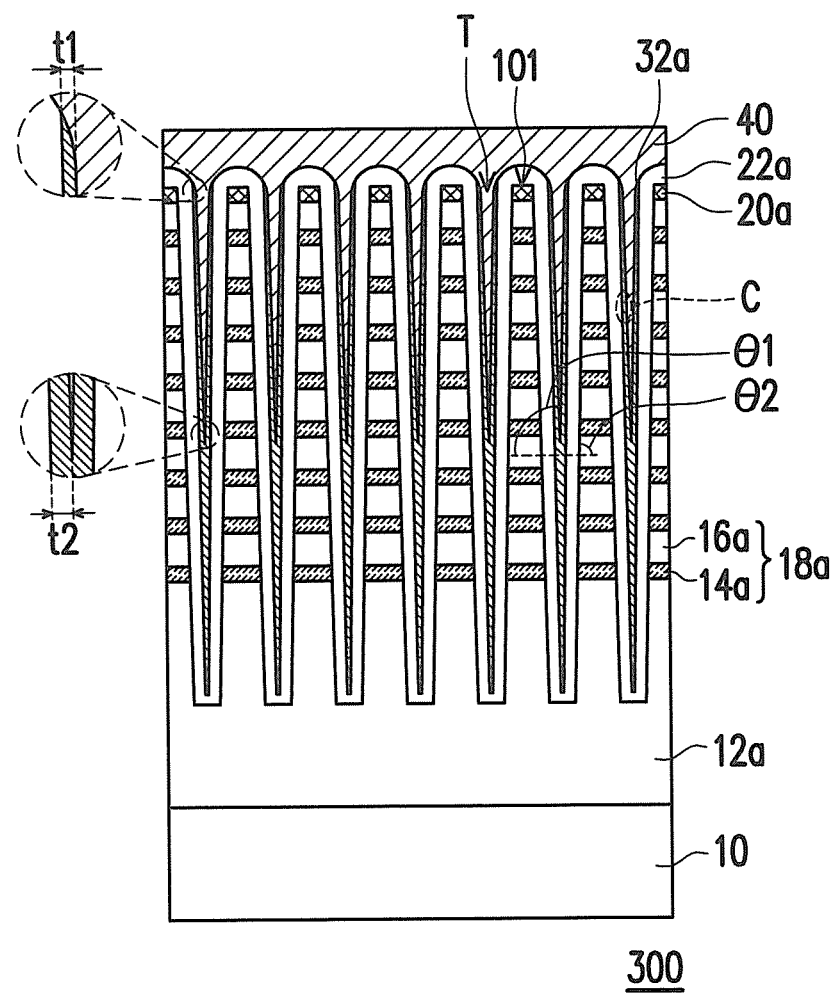

Then, referring to FIG. 3F, a conductor material layer 40 is formed on top parts of the charge storage layers 22a of the fin structures 101 and the surfaces of the conductor layers 32a. The conductor material layer 40 fills the trenches T and is electrically connected with the conductor layers 32a. A material of the conductor material layer 40 is polysilicon, doped polysilicon, a metal material, or a combination thereof, for example. The doped polysilicon is N+ doped polysilicon or P+ doped polysilicon, for example. A method of forming the conductor material layer 40 includes performing a chemical vapor deposition process. In an embodiment, a thermal treatment may also be performed to the conductor layer 32a and the conductor material layer 40, such that voids in the conductor layer 32a and the conductor material layer 40 are diffused externally or accumulate at the top part of the trench T. A method of performing the thermal treatment includes rapidly increasing a temperature of the conductor layer 32a and the conductor material layer 40 to a range of 800° C. to 1100° C. and immediately cooling the conductor layer 32a and the conductor material layer 40 to a range of 25° C. to 100° C., or heating the conductor layer 32a and the conductor material layer 40 to a range of 600° C. to 1000° C. and maintaining the temperature for 1 hour to 24 hours, for example. A rate of increasing the temperature is in a range of 300° C./hour to 500° C./hour, for example. An environment of the thermal treatment is a hydrogen atmosphere, for example. A method of increasing the temperature includes heating by using laser pulse, for example.

Then, referring to FIGS. 1A, 1B, and 3F at the same time, the conductor layer 32a and the conductor material layer 40 are patterned, so as to form the conductor layers 32b and the conductor layers 40a on the substrate 10. Each of the conductor layers 32b extends in a direction different from the extending direction of the fin structure 101. The conductor layers 32b and the fin structures 101 are perpendicular to each other, for example. Each of the conductor layers 32b is located in the trench T and covers a part of the sidewall of the fin structure 101. Each of the conductor layers 40a is located on the charge storage layers 22a of the fin structures 101, extends into the trenches T, and covers the surfaces of the conductor layers 32b. Each of the conductor layers 40a also covers the charge storage layers 22a on the top surfaces of the fin structures 101.

It should be noted that since the circulating processes are used in the invention to form the conductor layer 32a thinner at the upper part and thicker at the lower part on the sidewall of the fin structure in advance to reduce an aspect ratio of the trench, so that it becomes easier to fill the trenches when forming the conductor material layer 40. Therefore, compared with the device of the conventional art where the conductor material layer is directly filled into the trenches, voids are less likely to generate in the trenches T of the semiconductor device 300 of the invention.

Although the embodiment above describes the configuration that the stack layer 18a and the charge storage layer 22a form the fin structure 101, the method of fabricating the semiconductor device according to the invention is not limited thereto. In the following, another embodiment is provided to illustrate this point. In addition, description about processes/components that are the same as or similar to the processes/components of the above embodiment will be omitted in the following description.

Figure 4A:
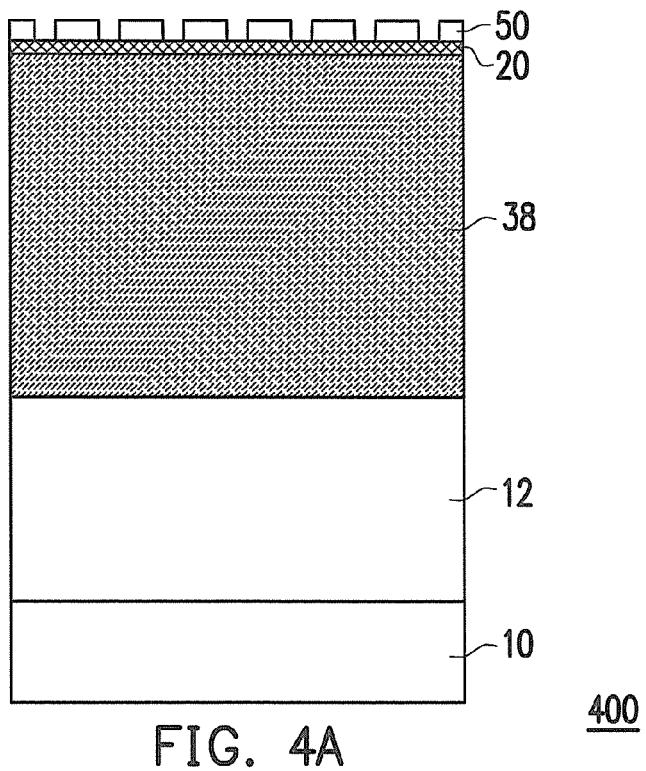
FIGS. 4A to 4B are schematic cross-sectional views illustrating a method of fabricating a semiconductor device according to another embodiment of the invention.
Figure 4B:
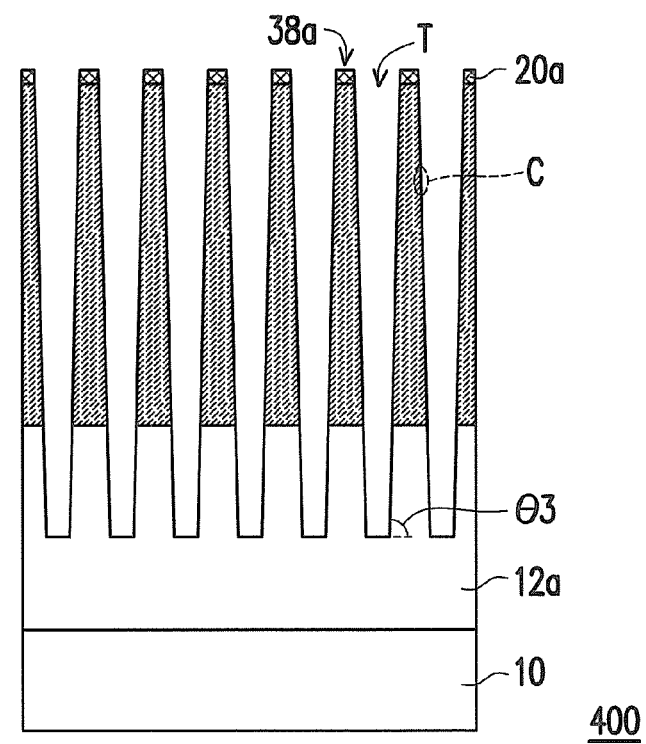

FIGS. 4A to 4B are schematic cross-sectional views illustrating a semiconductor device according to another embodiment of the invention.

Referring to FIG. 4A, a difference from the above embodiment is that while a method of fabricating a semiconductor device 400 according to another embodiment of the invention is similar to the method of fabricating the semiconductor device 300, a conductor layer 38, instead of the dielectric layer 16, is formed on the dielectric layer 12 after forming the dielectric layer 12 on the substrate 10. A material of the conductor layer 38 is the same as those in the description about the strip layer 38a, and is thus not repeated below. A method of forming the conductor layer 38 includes performing a chemical vapor deposition process. Then, the hard mask layer 20 is formed on the conductor layer 38, and the patterned photoresist layer 50 is formed on the hard mask layer 20.

Referring to FIG. 4B, by using the patterned photoresist layer 50 as a mask and performing an etching process, the strip layers 38a are formed on the substrate 10 and the trenches T are formed between the strip layers 38a. Details with respect to performing the etching process to the semiconductor device 400 are already described above. Therefore, details in this respect will not be repeated below.

Referring to FIGS. 2 and 4B at the same time, the subsequent steps of forming the charge storage layer 22a to form the fin structure 201, forming the conductor material layers 32 and 40, and reducing the thickness of the conductor material layer 32 and details of the steps are already described in the embodiments above. Therefore, details in this respect will not be repeated below.

In view of the foregoing, a first conductor material layer that is thinner at an upper part and thicker at a lower part is fog lied on the sidewall of the fin structure, so that a second conductor material layer formed subsequently has a preferable gap filling property. Accordingly, formation of unevenly distributed voids may be effectively prevented when the conductor material is filled into the trench with a high aspect ratio, so as to improve an electrical performance of the semiconductor device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a semiconductor device, comprising:
   forming a plurality of fin structures on a substrate, wherein there is a trench between the fin structures; and
   performing at least two times of circulating processes, so as to form a first conductor layer, wherein each time of the circulating processes comprise:
   a deposition process, filling a first conductor material layer in the trench, wherein the first conductor material layer covers top parts and sidewalls of the fin structures; and
   an etching process, removing a part of the first conductor material layer, wherein a first thickness of the first conductor layer is adjusted to be less than a second thickness of the first conductor layer, the first thickness is a thickness of the first conductor layer at upper parts of the sidewalls of the fin structures, and the second thickness is a thickness of the first conductor layer at lower parts of the sidewalls of the fin structures.

2. The method of fabricating the semiconductor device as claimed in claim 1, wherein after performing the circulating processes, the method further comprises: filling a second conductor material layer in the trench.

3. The method of fabricating the semiconductor device as claimed in claim 1, wherein a difference between the first thickness and the second thickness is adjusted to be greater than 1 Å and less than 5 Å.

4. The method of fabricating the semiconductor device as claimed in claim 1, wherein the circulating processes are performed, such that the thickness of the first conductor layer gradually decreases from the lower parts of the sidewalls of the fin structures to the upper parts of the sidewalls of the fin structures.

5. The method of fabricating the semiconductor device as claimed in claim 1, wherein the circulating processes are performed, such that a first angle between a surface of the first conductor layer and a surface of the substrate is less than a second angle between the sidewalls of the fin structures and the surface of the substrate.

6. The method of fabricating the semiconductor device as claimed in claim 1, wherein the step of forming the fin structures on the substrate comprises:
   forming a plurality of strip layers; and
   forming a charge storage layer to cover top parts and sidewalls of the strip layers.

7. The method of fabricating the semiconductor device as claimed in claim 1, wherein the step of forming the fin structures on the substrate comprises:
   forming a plurality of stack layers; and
   forming a charge storage layer to cover top parts and sidewalls of the stack layers.

8. The method of fabricating the semiconductor device as claimed in claim 7, wherein the step of forming the stack layers comprises: forming at least one conductor layer and at least one dielectric layer that are alternately stacked with respect to each other.

9. A semiconductor device, comprising:
   a substrate;
   a plurality of fin structures, located on the substrate; and
   a first conductor layer, covering sidewalls of the fin structures,
   wherein a first thickness of the first conductor layer is less than a second thickness of the first conductor layer, the first thickness is a thickness of the first conductor layer at upper parts of the sidewalls of the fin structures, and the second thickness is a thickness of the first conductor layer at lower parts of the sidewalls of the fin structures.

10. The semiconductor device as claimed in claim 9, wherein a difference between the first thickness and the second thickness is greater than 1 Å and less than 5 Å.

11. The semiconductor device as claimed in claim 9, wherein each of the fin structures comprises:
   a strip layer; and
   a charge storage layer, covering a top part and a sidewall of the strip layer.

12. The semiconductor device as claimed in claim 9, wherein each of the fin structures comprises:
   a stack layer; and
   a charge storage layer, covering a top part and a sidewall of the stack layer.

13. The semiconductor device as claimed in claim 12, wherein each stack layer comprises at least one second conductor layer and at least one dielectric layer that are alternately stacked with respect to each other.

14. The semiconductor device as claimed in claim 9, further comprising:
   a second conductor layer, covering a surface of the first conductor layer and a top part of the charge storage layer.

15. The semiconductor device as claimed in claim 9, wherein a thickness of the first conductor layer gradually decreases from the lower part of the sidewall of each of the fin structures to the upper part of the sidewall of each of the fin structures.

16. The semiconductor device as claimed in claim 9, wherein a first angle between a surface of the first conductor layer and a surface of the substrate is less than a second angle between the sidewall of each of the fin structures and the surface of the substrate.

17. A method of fabricating a semiconductor device, comprising:
   forming a plurality of fin structures on a substrate, wherein there is a trench between the fin structures;
   filling the trench with a conductor layer, wherein the conductor layer comprises a plurality of conductor material layers and covers top parts and sidewalls of the fin structures; and
   adjusting a first thickness of at least one conductor material layer to be less than a second thickness of the conductor material layer, wherein the first thickness is a thickness of the conductor material layer located at upper parts of the sidewalls of the fin structures, and the second thickness is a thickness of the conductor material layer located at lower parts of the sidewalls of the fin structures.

18. The method of fabricating the semiconductor device as claimed in claim 17, wherein a difference between the first thickness and the second thickness is adjusted to be greater than 1 Å and less than 10 Å.

19. The method of fabricating the semiconductor device as claimed in claim 17, wherein the thickness of the conductor material layer gradually decreases from the lower parts of the sidewalls of the fin structures to the upper parts of the sidewalls of the fin structures.

20. The method of fabricating the semiconductor device as claimed in claim 17, wherein a first angle between a surface of the conductor material layer and a surface of the substrate is less than a second angle between the sidewalls of the fin structures and the surface of the substrate.

* * * * *